United States Patent
Hoffman et al.

(10) Patent No.: US 6,482,672 B1
(45) Date of Patent: Nov. 19, 2002

(54) USING A CRITICAL COMPOSITION GRADING TECHNIQUE TO DEPOSIT INGAAS EPITAXIAL LAYERS ON INP SUBSTRATES

(75) Inventors: Richard W. Hoffman, Bay Village, OH (US); David M. Wilt, Bay Village, OH (US)

(73) Assignee: Essential Research, Inc., Cleveland, OH (US)

( * ) Notice: Subject to any disclaimer, the term of this patent is extended or adjusted under 35 U.S.C. 154(b) by 0 days.

(21) Appl. No.: 09/186,587

(22) Filed: Nov. 5, 1998

Related U.S. Application Data

(60) Provisional application No. 60/064,413, filed on Nov. 6, 1997.

(51) Int. Cl.$^7$ ............................................. H01L 21/20
(52) U.S. Cl. ........................... 438/94; 438/93; 438/503; 438/930; 438/936; 117/954
(58) Field of Search ............................ 438/94, 503, 93, 438/87, 930, 936; 117/105, 106, 954

(56) References Cited

U.S. PATENT DOCUMENTS

| | | |
|---|---|---|
| 5,373,521 A | 12/1994 | Takahashi |
| 5,387,796 A | 2/1995 | Joshi et al. |
| 5,391,896 A | 2/1995 | Wanlass |
| 5,479,032 A | 12/1995 | Forrest et al. |
| 5,518,934 A | 5/1996 | Forrest et al. |
| 6,300,557 B1 * | 10/2001 | Wanlass ....................... 136/255 |

OTHER PUBLICATIONS

High–Performance, Lattice–Mismatched InGaAs/InP Monolithic Interconnected Modules (MIMs) 1998 NREL TPV Conference.

InGaAs/InAsP lasers with output wavelengths of 1.58–2.45 μm Martinelli, Zamerowski, and Longeway Appl. Phys. Lett., vol. 54, No. 3, Jan. 16, 1989.

Efficient 2.0–2.6 μm Wavelength Photoluminescence from Narrow Bandgap InAsP/ InGaAs Double Heterostructures Grown on InP Substrates Journal of Electronic Materials, vol. 25, No. 9, 1996.

Selective area MOVPE growth of InP, InGaAs and InGaAsP using TBAS and TBP at different growth conditions—Journal of Crystal Growth 170 (1997) 645–649.

* cited by examiner

*Primary Examiner*—Mary Wilczewski
(74) *Attorney, Agent, or Firm*—Fay, Sharpe, Fagan, Minnich & McKee, LLP

(57) ABSTRACT

A method for growing $In_xGa_{1-x}As$ epitaxial layer on a lattice mismatched InP substrate calls for depositing by organo-metallic vapor phase epitaxy, or other epitaxial layer growth technique, a plurality of discreet layers of $InAs_yP_{1-y}$ over an InP substrate. These layers provide a buffer. Each succeeding buffer layer has a distinct composition which produces less than a critical amount of lattice mismatch relative to the preceding layer. An $In_xGa_{1-x}As$ epitaxial layer is grown over the buffer wherein $0.53 \leq x \leq 0.76$.

A resulting InGaAs structure comprises an InP substrate with at least one InAsP buffer layer sandwiched between the substrate and the InGaAs epitaxial layer. The buffer layer has a critical lattice mismatch of less than 1.3% relative to the substrate. Additional buffer layers will likewise have a lattice mismatch of no more than 1.3% relative to the preceding layer. The number of buffer layers is determined by the resulting bandgap desired in the InGaAs epitaxial layer, which, in turn, determines the composition of the $In_xGa_{1-x}As$ epitaxial layer, and thus, the lattice mismatch.

10 Claims, 2 Drawing Sheets

USING A CRITICAL COMPOSITION GRADING TECHNIQUE TO DEPOSIT INGAAS EPITAXIAL LAYERS ON INP SUBSTRATES

This application claims the benefit of Provisional Application Serial 60/064,413 filed Nov. 6, 1997.

The U.S. Government has a paid-up license in this invention and the right in limited circumstances to require the patent owner to license others on reasonable terms as provided for by the terms of PR. No. 73-907775 awarded by Bettis Atomic Power Laboraty.

BACKGROUND OF THE INVENTION

In thermophotovoltaic (TPV) energy conversion, infrared light radiated by a heat source is converted to electricity using a semiconducting junction. To convert infrared light efficiently, semiconductors with low bandgaps are required. Bandgaps in the range of 0.55 eV to 0.74 eV respond to parts of the infrared light spectrum that have practical commercial application. The bandgap of 0.55 eV is targeted for most low-temperature TPV systems.

Large area single crystals used in semiconductors cannot be grown in bulk form at these bandgaps. Ternary compounds, such as InGaAs, can be grown by gas-phase processes to produce layers within the desired bandgap range, i.e., between 0.55 eV to 0.74 eV. To date, there are no known substrates with the same lattice constants as the desired InGaAs composition. Hence, lattice mismatched compositions are grown. The resulting strain due to lattice-mismatched layers typically relaxes by generating a high defect concentration that causes less than optimal device performance.

In the past, the use of quaternary growth methods, such as in the case of GaInAsSb deposited on GaSb substrates, have made it possible to manipulate the bandgap of the epitaxial layer independently from the lattice constant. As a result, lattice-matched, relatively dislocation-free layers have been grown at the desired bandgap. However, quaternary growth systems are very complex and difficult to implement on a commercial scale.

A critical composition buffering technique as first described in V. Krishnamoorthy, P. Ribas, and R. M. Park, *Appl. Phys. Lett.* 58 (1991) pg. 2000, was later applied to the growth of InGaAs on GaAs substrates using molecular beam epitaxy (MBE) as the growth technique. V. Krishnamoorthy, Y. W. Lin, and R. M. Park, "Application of 'critical composition difference' concept to the growth of low dislocation density InGaAs on GaAs", *J. Appl. Phys.*, 72 (1992) pg. 1752.

In critical composition buffering, the dislocation density in the epitaxial layer is dependent on the compositional difference between the epitaxial layer and the substrate. In the case of a single layer comprising $In_xGa_{1-x}As$ grown on GaAs, when x is kept below x=0.18, the epitaxial layer is dislocation free. In other words, when the relative concentration of In between the epitaxial layer and the substrate is kept below 18%, the dislocation density in the epitaxial layer remains below 10 $cm^{-2}$.

Dislocations that are observed in the GaAs substrate do not propagate into the epitaxial layer. However, when the critical composition is exceeded (x>0.18), dislocations are observed in the epitaxial layer. It is thought that by controlling the relative composition between layers, the underlying layer, (i.e., the substrate, for example) has a lower yield strength than the layer being deposited. Therefore, dislocations created due to lattice-mismatch predominately propagate into the softer material. The strain caused by lattice mismatch is relieved and the top layer is relatively dislocation free.

If the composition ultimately desired has a higher In concentration than the critical composition difference, additional buffering layers can be used. Each layer in the buffer structure will have an In content less than the critical composition difference with respect to the previous layer.

Determining the composition of each layer is not straight forward. The important composition is not the actual alloy composition, but the "effective" composition. That is, due to incomplete lattice relaxation, the epitaxial layer will appear to have a composition different from the actual composition when the composition is inferred from x-ray diffraction measurement of lattice parameter. Therefore, to successfully employ the critical composition buffering technique, the effective composition of each layer is measured. The composition of the subsequent layer can then be determined. Effective composition can be measured by interrupting growth after each layer and measuring its lattice parameter (effective composition) and actual composition with x-ray diffraction and other analytical techniques.

There is a limit to the ultimate composition that can be grown dislocation free. This limit is determined by how the yield strength varies with composition. In the case of $In_xGa_{1-x}As$, yield strength increases with In concentration up to a maximum of x=0.5. As the In is increased beyond this level, successive layers are weaker and critical composition buffering does not work.

In order to achieve a desired bandgap for the InGaAs epitaxial layer, it is important to develop an appropriate buffer structure. A proper buffer structure is necessary to accommodate the lattice strain produced when growing InGaAs compositions with different lattice constants than the substrate. These alloys are said to be "lattice mismatched" to the substrate. Lattice strain causes defects in the semiconductor. The defects are electrically active and degrade electrical performance. In photovoltaic devices, this degradation is observed as an increased reverse saturation current or dark current and reduced minority carrier diffusion lengths. A buffer that could accommodate the strain thereby preventing defects in the overlying active layers is highly desirable.

U.S. Pat. No. 5,387,796 to Joshi et al. suggests the use of buffer layering in connection with growing InGaAs compositions over the InP substrate. The buffer disclosed in Joshi et al. is comprised of InAsP, deposited in discreet layers. Each layer has a distinct composition which varies only slightly from that of the previous layer. The layers are deposited by hydride vapor phase epitaxy. The InAsP composition of each subsequent layer in the buffer must be such as to produce a lattice mismatch of 0.13% or less relative to the preceding layer. After the growth of the InAsP buffer, the InGaAs active layer is grown and doped with sulfur to a specified concentration. After growth of the entire structure, the wafer is thermally cycled to further improve the quality of the InGaAs layer.

The need in Joshi et al. for a mismatch of 0.13% or less requires a large number of discreet buffer layer steps. For example, in a situation where a 0.6 eV InGaAs alloy is desired, the method of Joshi et al. requires eight intervening InAsP buffer layers between the InP substrate and the 0.6 eV InGaAs alloy. The manufacturing process is relatively cumbersome and lengthy with the requirement of small mismatch values and of so great a number of buffer layer steps.

This manufacturing process further calls for additional steps such as doping, thermal annealing or thermal cycling to reduce leakage current (i.e., dislocations) in the resulting photodectector.

In order to simplify the manufacturing process for producing InGaAs layers on InP substrates, there is a need to provide a buffering scheme that both eases the manufacturing process and reduces or eliminates the need for doping or heat treatment.

BRIEF DESCRIPTION OF THE INVENTION

The present invention is directed to the use of a novel buffering scheme for growing InGaAs on an InP substrate. The method is based on the critical composition difference technique and the yield strength characteristics of the InAsP alloy system.

A method for growing InGaAs epitaxial layer on a lattice mismatched InP substrate calls for depositing, by an epitaxial growth process at least one layer of $InAs_yP_{1-y}$ over an InP substrate to provide a buffer. Each succeeding $InAs_yP_{1-y}$ buffer layer has a distinct composition which produces less than a critical amount of lattice mismatch relative to the preceding layer. Each $InAs_yP_{1-y}$ layer has a lattice-mismatch between 0.26% and 1.3% relative to the previous layer. An $In_xGa_{1-x}As$ epitaxial layer is grown over the buffer wherein $0.53 \leq x \leq 0.76$. The desired InGaAs alloy is grown lattice-matched to the uppermost InAsP buffer layer. The resulting InGaAs epitaxial layer has a bandgap in the range of about 0.55 eV to about 0.74 eV.

A resulting photovoltaic InGaAs structure comprises an InP substrate with at least one InAsP buffer layer sandwiched between the substrate and the InGaAs epitaxial layer. The buffer layer has a critical lattice mismatch between 0.26% and 1.3% relative to the InP substrate. Additional buffer layers will likewise have a lattice mismatch between 0.26% and 1.3% relative to the preceding layer. The number of buffer layers is determined by the resulting bandgap desired in the InGaAs epitaxial layer, which, in turn, determines the composition of the $In_xGa_{1-x}As$ epitaxial layer.

An advantage of the present invention is that only a small number of buffer layers are required prior to the deposition of the $In_xGa_{1-x}As$. This results from the high level of lattice mismatch. In case of a resulting bandgap of 0.6 eV wherein x=0.68, only two buffer layers are needed. This simplifies the manufacturing process and is, hence, an economical improvement over the prior art. The fewer layers that are required leads to shorter durations in the reactor where the layers are deposited. There are savings in manufacturing time.

Another advantage of the present invention is that the relative thickness of each buffer layer is beyond a critical thickness at which point the strain caused by lattice mismatched is 95-99% relaxed. Hence, there is little or no long term degradation of the resulting photovoltaic cell. The cell offers good performance capabilities.

Superior device performance is realized in the present invention compared to devices fabricated using compositionally stepped, InGaAs buffer layers.

Still other advantages and benefits of the invention will become apparent to those skilled in the art upon a reading and understanding of the following detailed description.

DETAILED DESCRIPTION OF THE INVENTION

Figure 1:
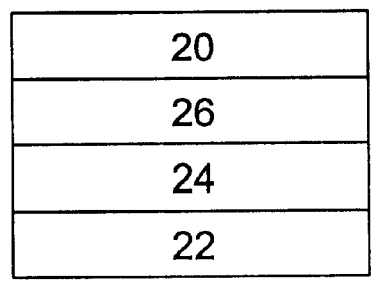
FIG. 1 is a schematic representation of an InGaAs/InAsP/InP structure in accordance with the present invention.

The present invention is directed to the formation of a dislocation-free ($<10^4$ cm$^{-2}$) InGaAs layer with a bandgap between 0.55 eV and 0.74 eV for a thermophotovoltaic (TPV) cell. InGaAs is grown by organo-metallic vapor phase epitaxy (OMVPE) of the correct composition to produce a bandgap in this range. OMVPE is a commercially viable technique for growing crystals over a large area and is the technique used for production of commercial solar cells for space use. Typically, InGaAs is grown on InP substrates. The lattice matched composition of $In_xGa_{1-x}As$ where x=0.53, produces the bandgap of 0.74 eV. Growing other InGaAs compositions on InP substrates requires lattice-mismatched growth which can result in strained or relaxed layers. Strained layers are metastable and may relax uncontrolled during subsequent processing and destroy device performance. The InGaAs may relax by forming defects such as dislocations. The device performance is generally reduced due to the electrical activity of the defects formed. Because the In content of the $In_xGa_{1-x}As$ composition required for a 0.55 eV bandgap is greater than 50%, softer InGaAs buffer layers would be grown on top of stronger InGaAs layers with relaxation occurring in the softer InGaAs by defect formation. Thus, any buffering scheme based on InGaAs will not work to minimize the defect formation in the electrically active regions of the device. The performance of the InGaAs device will be poor due to increased level of dark current due to recombination within the defects.

InAsP alloys are used as the buffer. InP is grown epitaxially to the InP substrate. The epitaxial growth process is preferably organo-metallic vapor phase epitaxy, although other epitaxial growth processes can be used such as, but not including, MBE. By adding As, the InAsP ternary compounds are grown in stepped composition layers until the lattice constant of the InAsP layer matches that of the 0.55 eV InGaAs compound. The critical composition technique is employed in selecting the specific alloy compositions and number of layers in the InAsP buffer. These InAsP compositions are below the maximum yield strength of the alloy, which occurs at an As content of 50%. Therefore, critical composition buffering works to produce a dislocation-free InAsP layer, upon which an InGaAs layer can be grown lattice-matched and dislocation free.

Another key feature is found in the case where the bandgap of the final InAsP alloy is large with respect to the bandgap of the InGaAs. For example, when the bandgap of the final InAsP layer is 0.94 eV, it is lattice matched to the InGaAs compound with a bandgap of 0.55 eV. The wider bandgap can be used to advantage in TPV cell structures. InAsP can be used as surface passivating layers for both front and rear active InGaAs surfaces.

The method of the present invention improves upon the method described in Joshi et al. where $In_xGa_{1-x}As$ photodetectors are grown onto InP substrates. Here, the steps taken between layers are, in general, substantially larger than the upper limit required by Joshi et al., and fewer in number. Further, no subsequent heat treatment or buffer layer doping is required to produce high quality InGaAs layers in the present invention. The present invention does not call for thermal cycling. The vapor depositing takes place at temperatures at which OMVPE normally occurs for these compounds.

Lattice mismatch between layers in the present invention (including the InP substrate) can be as high as 1.3% and preferably greater than 0.26%. A preferred range of lattice mismatch is in the range of at least 0.45%–0.65%. A most preferred range of lattice mismatch is in a range of about 0.49% to about 0.60%.

With regard to the $InAs_yP_{1-y}$ buffer, approximately one to four or five buffer layers are used to step from InP to the lattice constant of the desired InGaAs epitaxial layer. While as little as one InAsP step can be used for certain compositions of InGaAs, two steps are the most preferred, particularly in the case of the composition $In_{68}Ga_{32}As$ (for a bandgap of 0.6 eV). The change in the level of "y" between layers is generally a step up or an upward increment of about 0.10–0.20; preferably in the range of about 0.13–0.18, most preferably in the range of about 0.14–0.175.

A buffer structure can be used successfully to grow an epitaxial layer mismatched to the substrate as long as each subsequent layer in the buffer is stronger (has a higher yield strength) than the preceding one. When such a buffer is grown, the dislocations created by lattice mismatch are forced down into the underlying softer layers of the buffer. The topmost layer remains dislocation free.

In addition, in order to successfully employ this type of buffer, the buffer must be in compression relative to the substrate. That is, the lattice constant of the buffer layer must be larger than that of the substrate. Otherwise, the buffer layer is in tension and will develop cracks, resulting in defect propagation into active device layers.

Typically, a material increases in yield strength up to a 50—50 mix of its constituents. For $In_xGa_{1-x}As$, alloy strength is expected to increase until there are equal amounts of In and Ga in the alloy (x=0.5), after which further increases of In content cause the alloy to become weaker. For $InAs_yP_{1-y}$ the alloy should increase in strength until there are equal amounts of As and P (y=0.5). Although the yield strength of the various layers has not been actually measured, it is apparent from the growth results that this basic principle of materials science is followed.

For the buffer layers, the value of "y" could range from 0.025 to 0.35. However, it has been discovered that by stepping the level of y by an increment of at least 0.10 between layers, or from one layer to the next, significantly "thick" buffer layers will form which provides for relaxed layers provided the critical thickness has been surpassed.

It is not possible to grow a high-quality InGaAs layer with a bandgap less than 0.74 eV on an InP substrate by using an InGaAs buffer. This is because the InGaAs composition is graded toward increasingly weak layers. However, it is possible to use an InAsP buffer to grade between the lattice constant of InP and lower bandgap InGaAs compositions.

The idea of critical composition establishes an upper limit in the allowed step between layers. In the $In_xGa_{1-x}As$ system, the critical composition is x=0.18. Applying an equivalent strain derived from the InGaAs system to the $InAs_yP_{1-y}$ system results in a critical composition of y=0.35. Thus, in theory, one can accommodate the lattice mismatch between the InP substrate and the 0.6 eV InGaAs alloy using only one single step of InAsP buffer. In practice, we found that a two step buffer layer yielded better performance than a single step buffer, however, additional buffer layers using smaller compositional steps provided no additional benefit.

EXAMPLE

As shown in FIG. 1 an active $In_xGa_{1-x}As$ layer (20) is grown with a composition of x=0.68 to produce a bandgap of 0.6 eV. The layers in FIG. 1 are the InP substrate (22), the first $InAs_yP_{1-y}$ buffer layer (24) with y=0.16 producing a mismatch of 0.58%, a second $InAs_yP_{1-y}$ layer (26) with y=0.32 producing a mismatch of 0.51% to the first layer and the first active 0.6 eV InGaAs layer (20) lattice-matched to the second InAsP layer (26). In this example, two buffer layers (24, 26) are used to transition between the lattice constant of the InP substrate (22) and the desired InGaAs composition. The thickness of the InAsP buffer layers must be greater than the critical thickness for the amount of mismatch to the previous layer. The thickness of the InGaAs layer or layers or other compounds will depend on the specific device.

Figure 2:
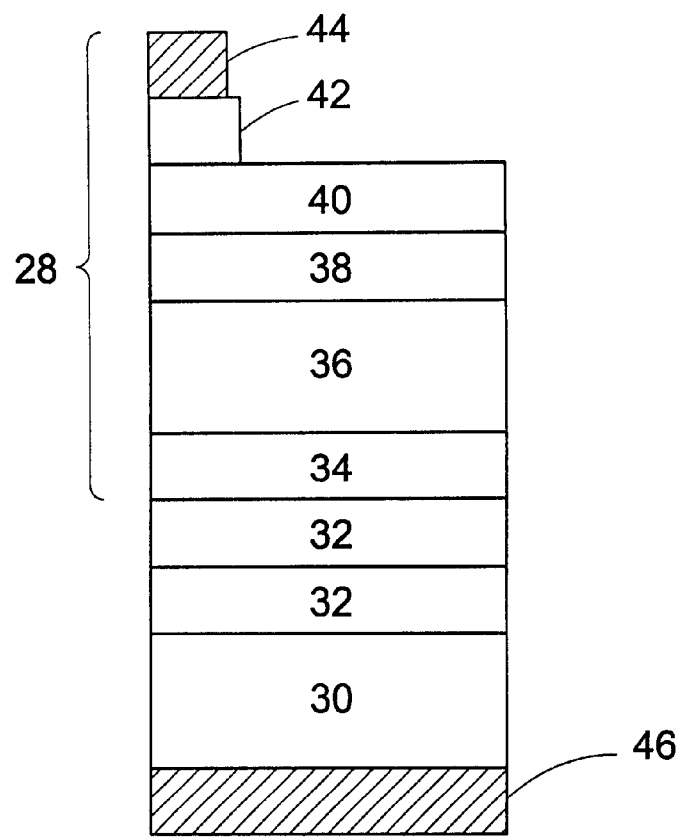
FIG. 2 is a schematic representation of a 0.6 eV InGaAs photovoltaic cell in accordance with the present invention.

With attention to FIG. 2, we fabricated 0.6 eV InGaAs photovoltaic cells on conductive InP substrates using the buffer structure in FIG. 1 between the active device layers (28) and the substrate (30), with the InAsP layers (32) doped n-type using Si to $10^{18}$ carriers/cm². The active layers had a p-on-n (p/n) polarity and consisted of a n-type InPAs back surface minority carrier mirror (34), a n-type InGaAs base (36), a p-type InGaAs emitter (38), a p-type InPAs front passivating window (40) and a p-type InGaAs contact layer (42). The contact layer was later removed by wet chemical etching so that it only remained below the front grid metallization (44). The negative contact (46) was formed by metallization of the back surface of the substrate.

Figure 3:
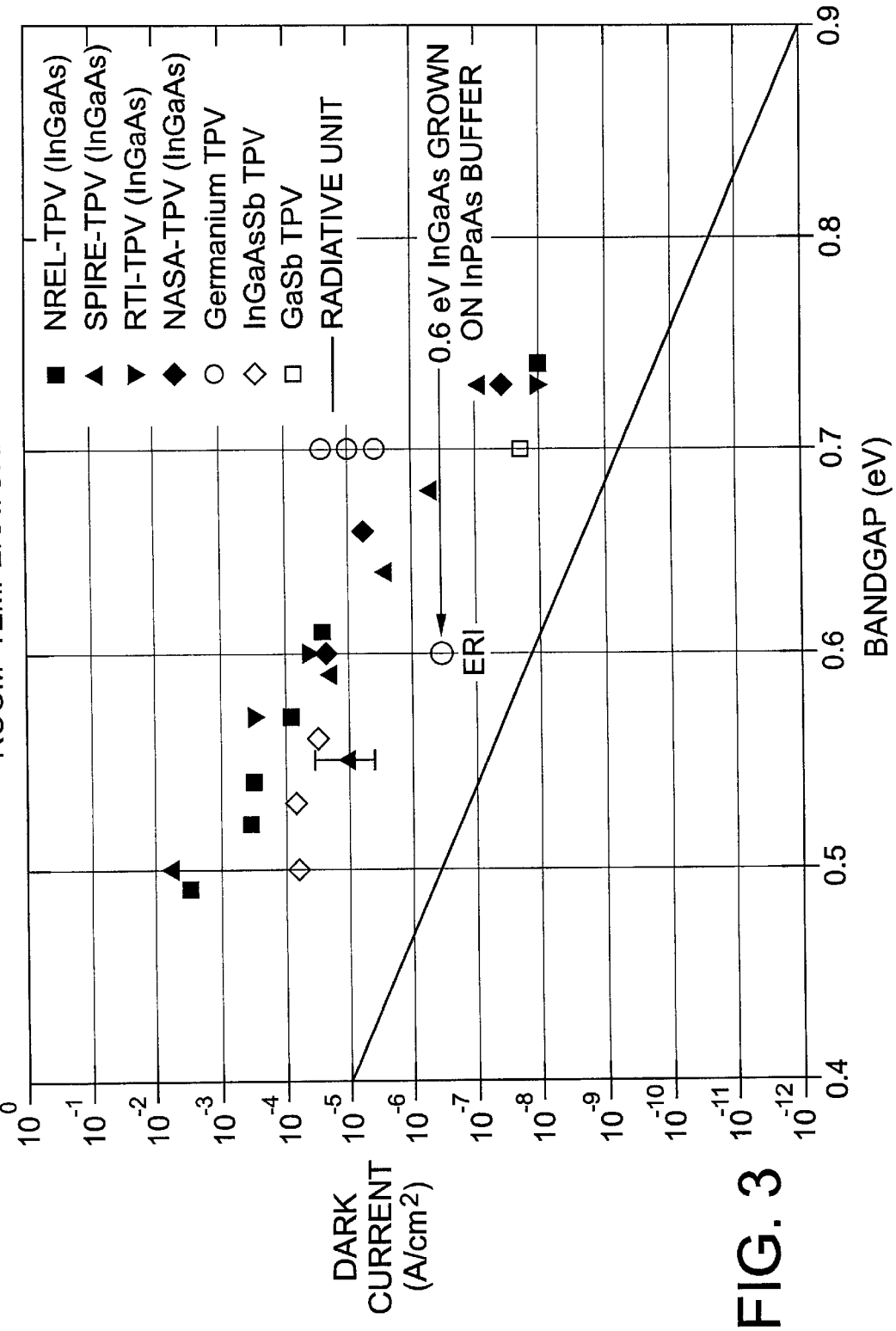
FIG. 3 is a graphical comparison of dark current density for low bandgap devices.

The evidence of the success of the InPAs buffer is demonstrated by comparing device performance to devices using InGaAs buffer layers. The data in FIG. 3 is borrowed from a compilation of results by G. N. Charache, et al., 25th IEEE PVSC Conf. p. 140, 1996. It represents the lowest dark current achieved for low bandgap cells as a function of bandgap (composition or mismatch to InP). The theoretical limit of dark current is represented as a straight line on the figure. For the specific 0.6 eV InGaAs device, the use of the critical composition InPAs buffer reduced the dark current by almost two orders of magnitude compared to 0.6 eV InGaAs devices using an InGaAs buffer. The lowest dark current density for 0.6 eV InGaAs using an InGaAs buffer was $3 \times 10^{-5}$ A/cm². A dark current density of $4.1 \times 10^{-7}$ A/cm² was obtained using the present invention.

Monolithic Interconnected Module (MIM) devices based on the 0.6 eV InGaAs growth on the InPAs buffer of the present invention were also fabricated. The MIM cell design is a monolithically interconnected group of small area cells. One advantage of the MIM configuration is the spectral control of the incident light by using a back surface reflector. In these structures, the InAsP buffer was grown undoped and the substrate is not conductive. We fabricated conventional MIM cells, using 15 individual subcells interconnected to a single 1×1 cm area device, which demonstrated dark current value of $1.9 \times 10^{-6}$ A/cm². The fill factor value of 68% was maintained at short circuit current densities of 2 A/cm².

Another example is the use of the buffer to adjust the bandgap of detectors. It is anticipated that the very low dark currents would improve the sensitivity of detectors based on mismatched InGaAs on InP substrates.

The reduction in the number of buffer layers compared to the prior art simplifies the manufacturing process and provides and important advance in the state of the art.

The invention has been described with reference to the preferred embodiment. Obviously modifications and alterations will occur to others upon a reading and understanding of this specification. It is intended to include all such modifications and alterations insofar as they come within the scope of the appended claims or the equivalents thereof.

Having thus described the preferred embodiment, the invention is now claimed to be:

1. A method for growing an InGaAs expitaxial layer on a lattice mismated InP substrate, comprising the steps of:

providing an InP substrate;

depositing one or more $InAs_yP_{1-y}$ buffer layers on the InP substrate by an epitaxial growth process, each $InAs_yP_{1-y}$ layer having a lattice-mismatch greater than 0.26% but less than 1.3% relative to the previous layers;

stepping a level of y by an increment of at least 0.13 between successive layers; and depositing an $In_xGa_{1-x}As$ epitaxial over the $InAs_yP_{1-y}$ buffer wherein $0.53 \leq x \leq 0.76$ and the InGaAs is lattice matched to the uppermost InAsP buffer layer.

2. The method of claim 1 wherein the $In_xGa_{1-x}As$ epitaxial layer has a band gap in the range of about 0.55 eV to about 0.74 eV.

3. The method of claim 1 wherein a second $InAs_yP_{1-y}$ layer is grown on a first $InAs_yP_{1-y}$ layer with a lattice mismatch as high as 1.3% relative to the underlying layer.

4. The method of claim 1 wherein the steps of depositing are done at temperatures at which vapor phase epitaxy occurs without a need for subsequent heat treatment.

5. The method of claim 1 wherein a value of y increases by-an upward increment between 0.13 and 0.35.

6. The method of claim 1 including the step of;

depositing up to two $InAs_yP_{1-y}$ buffer layers on the InP substrate by an epitaxial growth process.

7. A method for growing an InGaAs epitaxial layer on an InP substrate, comprising the steps of:

depositing by an epitaxial growth process two or less discreet layers of $InAs_yP_{1-y}$ over an InP substrate to provide a buffer, each succeeding buffer layer having a distinct composition which produces less than a critical amount of lattice mismatch relative to the preceding layer and increasing yield strength;

stepping a level of y by an increment of at least 0.13 between layers; and growing an $In_xGa_{1-x}As$ epitaxial layer over the buffer, wherein $0.53 \leq x \leq 0.76$.

8. The method of claim 7 wherein the $InAs_yP_{1-y}$ layer has a lattice mismatch no more than 1.3%.

9. The method of claim 8 wherein the $InAs_yP_{1-y}$ layer has a lattice mismatch greater than 0.26%.

10. The method of claim 7 wherein a change is y between layers is an upward step between 0.13 and 0.35.

* * * * *